United States Patent [19]

Murakami

[11] Patent Number: 4,838,088
[45] Date of Patent: Jun. 13, 1989

[54] PRESSURE TRANSDUCER AND METHOD FOR FABRICATING SAME

[75] Inventor: Koichi Murakami, Yokosuka, Japan

[73] Assignee: Nissan Motor Co., Ltd., Yokohama, Japan

[21] Appl. No.: 74,893

[22] Filed: Jul. 16, 1987

[30] Foreign Application Priority Data

Jul. 18, 1986 [JP] Japan .................... 61-168079

[51] Int. Cl.$^4$ ............... G01L 7/08; G01L 9/12
[52] U.S. Cl. ................... 73/724; 73/718; 361/283
[58] Field of Search ........... 73/724, 718, 721, 770, 73/726, 727, DIG. 4; 361/283; 128/748, 673, 675; 29/610 SG; 338/4

[56] References Cited

U.S. PATENT DOCUMENTS

| 3,678,378 | 7/1972 | Trott et al. | 324/61 R |
| 4,432,007 | 2/1984 | Cady | 361/283 |
| 4,665,610 | 5/1987 | Barth | 29/580 |

FOREIGN PATENT DOCUMENTS

| 0003387 | 8/1979 | European Pat. Off. |
| 0136249 | 4/1985 | European Pat. Off. |
| 2709945 | 9/1977 | Fed. Rep. of Germany |
| 3445774A1 | 7/1985 | Fed. Rep. of Germany |
| 3445775A1 | 7/1985 | Fed. Rep. of Germany |
| G8508300.3 | 9/1985 | Fed. Rep. of Germany |
| 3535904A1 | 4/1986 | Fed. Rep. of Germany |
| 58-63826 | 4/1983 | Japan |

OTHER PUBLICATIONS

S. Sugiyama et al., "Micro-Diaphragm Pressure Sensor", Proceedings of the 6th Sensor Symposium, 1986, pp. 23-27.
K. Yamada et al., "A Piezoresistive Integrated Pressure Sensor", Sensors and Actuators, No. 4, 1983, pp. 63-69.
Keller, H. W., "Piezoresistive Druckaufnehmer", Messen & Pruefen/Automatik, Feb., 1974, pp. 89-92.

Primary Examiner—Donald O. Woodiel
Attorney, Agent, or Firm—Foley & Lardner, Schwartz, Jeffery, Schwaab, Mack, Blumenthal & Evans

[57] ABSTRACT

A pressure transducer is composed of a substrate, a pressure sensing diaphragm layer and a support layer interposed between the substrate and the diaphragm layer, and a transduction element for coverting a displacement of the diaphragm layer into an electric signal. The support layer has an opening which is hermetically sandwiched between the substrate and the diaphragm layer so that there is formed sealed internal cavity used as a built-in reference pressure chamber. Preferably, the diaphragm layer includes a perforated inner layer extending over the cavity and a cover layer formed on the inner layer so as to seal the cavity. This transducer is fabricated by a process including a first step of forming the support layer on the substrate, a second step of forming the inner layer of the diaphragm layer on the support layer and forming perforations in the inner layer by etching, a third step of forming the opening in the support layer by etching through the perforations and a fourth step of forming the cover layer on the perforated inner layer to seal the internal cavity.

18 Claims, 11 Drawing Sheets

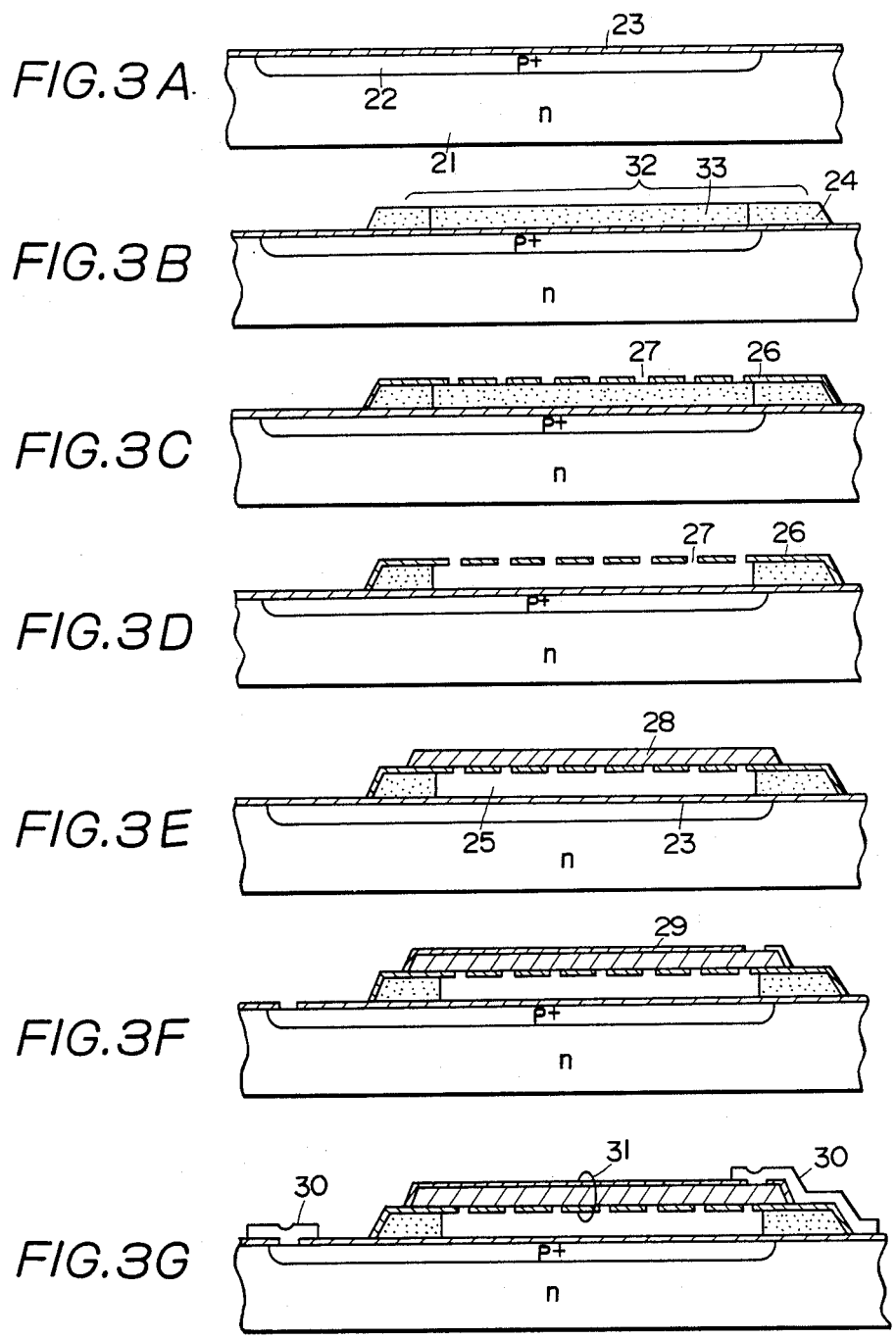

PRESSURE TRANSDUCER AND METHOD FOR FABRICATING SAME

BACKGROUND OF THE INVENTION

The present invention relates to an electrical pressure transducer which detects a fluid pressure and produces an electrical signal representing the pressure, and more specifically to a pressure transducer having a reference pressure chamber formed inside a sensor chip.

FIG. 12 shows one conventional pressure sensor (as disclosed in Japanese patent provisional publication No. 58-63826).

The device of FIG. 12 is an absolute pressure measurement type. A pressure sensor chip 1 is bonded through an adhesive layer 7 onto a pedestal 4, which is in turn, bonded through another adhesive layer 8 onto a stem member 5. The sensor chip 1 is connected through lead wire 2 to lead pins 3, and enclosed in a vacuum reference chamber 10, which is formed by hermetically joining a cap 6 onto the stem member 5 by welding or soldering, and sealing a hole 12 of the cap 6 by a solder 9 in a vacuum. A measurand pressure to be measured is applied to the bottom of the sensor chip 1 through a bore of a tubular portion 11 of the stem member 5 and a bore of the pedestal 4.

However, this conventional pressure sensor is disadvantageous in that it is necessary to form the hermetically sealed vacuum reference chamber 10 in the sensor housing, and accordingly it requires a large expenditure to package the sensor chip 1 in the sensor housing. Besides, care must be directed to selection of materials of the pedestal 4, and the adhesive layers 7 and 8 in order to reduce thermal stresses due to difference in thermal expansion coefficient between the sensor chip 1 and the stem member 5.

SUMMARY OF THE INVENTION

It is an object of the present invention to provide a pressure transducer which is easy to package, and capable of reducing manufacturing cost, and to provide a process for fabricating such a pressure transducer.

A pressure transducer according to the present invention comprises a substrate, a pressure sensing diaphragm layer, a diaphragm support layer interposed between the substrate and the diaphragm layer and having an opening, both sides of which are closed by the substrate and the diaphragm layer to form a hermetically sealed internal cavity serving as a reference pressure chamber, and means for converting a displacement of the diaphragm layer into an electric signal.

The diaphragm layer may comprise an inner layer extending over the cavity so as to constitute a ceiling of the cavity, and having a plurality of perforations opening into the cavity, and a cover layer which is formed on the inner layer and closes the perforations so as to seal the cavity.

A fabricating process according to the present invention comprises a first step of forming a support layer on a substrate, a second step of forming an inner layer on the support layer and forming perforations in the inner layer by etching, a third step of forming a cavity in the support layer under the inner layer by etching through the perforations of the inner layer, and a fourth step of forming a cover layer on the inner layer so as to seal the cavity. These steps are performed in sequence from the first step to the fourth step.

BRIEF DESCRIPTION OF THE DRAWINGS

FIGS. 3A–3G are sectional views showing sequential steps of a fabricating process of the first embodiment of the present invention.

DETAILED DESCRIPTION OF THE INVENTION

Figure 1A:
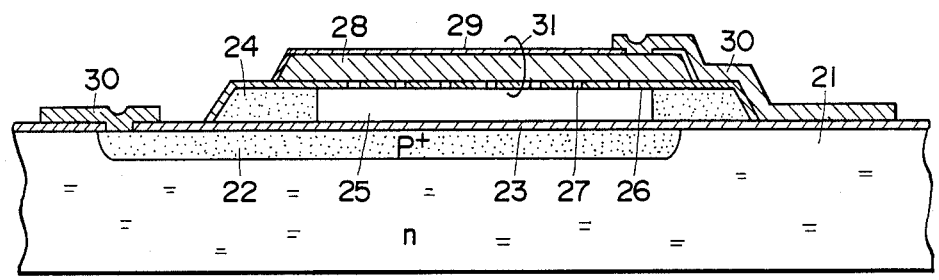
FIG. 1A is a sectional view showing a pressure transducer of a first embodiment of the present invention.
Figure 1B:
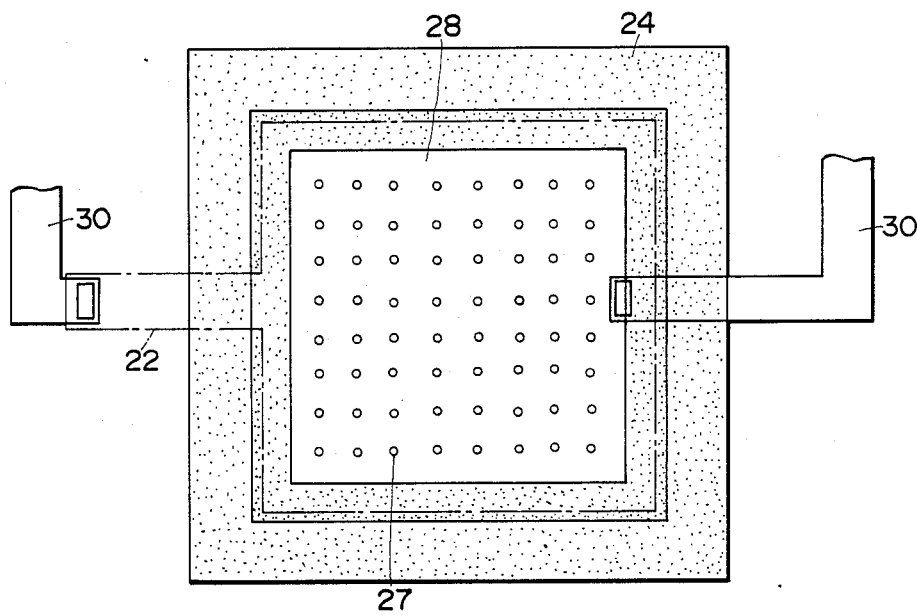
FIG. 1B is a plan view of the transducer of FIG. 1A.

A first embodiment-of the present invention is shown in FIGS. 1A and 1B.

A pressure transducer of FIGS. 1A and 1B is in a chip form, and has a silicon substrate 21. In one surface of the silicon substrate 21, there is formed a highly doped diffusion region 22, which is used as a lower electrode. The conductivity type of the diffusion region 22 is opposite to that of the substrate 21. In this embodiment, the diffusion region 22 is a $p^+$-type semiconductor, and the substrate 21 is an n-type semiconductor. A lower insulating layer 23 is formed on the surface of the highly doped diffusion region 22.

The transducer further has a diaphragm support layer 24 formed on the lower insulating layer 23, an upper insulating layer 26 formed on the support layer 24, and a cover layer 28 of a predetermined thickness formed on the upper insulating layer 26.

A cavity 25 is formed in the support layer 24, and a plurality of small perforations 27 are formed in the upper insulating layer 26. The cavity 25 is completely surrounded by a wall of the support layer 24. The bottom of the cavity 25 is closed by the lower insulating layer 23, and the top of the cavity 25 is closed by the upper insulating layer 26 and the covering layer 28. The small perforations 27 are formed in the ceiling of the cavity 25 which is formed by the upper insulating layer 26, and are arranged in a regular pattern as shown in FIG. 1B.

The cover layer 28 of this embodiment is made of conductive material, and used as an upper electrode. The cavity 25 is hermetically sealed by forming the cover layer 28 on the perforated upper insulating layer 26 under a predetermined reference pressure (for example, a vacuum equal to or less than 10 torr).

A surface protective insulating layer 29 is formed on the cover layer 28. Each of the lower insulating layer 23 and the surface insulating layer 29 is formed with a contact hole, and the lower and upper electrodes 22 and 28 are connected with metal leads 30, respectively, through the contact holes.

In the first embodiment, a pressure sensing diaphragm 31 is constituted by the upper insulating layer 26, the cover layer 28 and the surface insulating layer 29. An inner layer of the diaphragm 31 is constituted solely by the upper insulating layer 26. The cavity 25 is used as a reference pressure (vacuum) chamber, and the reference pressure in the cavity 25 is applied to the bottom side of the diaphragm 31. The diaphragm 31 deflects in accordance with a measurand pressure acting on the top side of the diaphragm 31. The diaphragm 31 moves inwardly toward the substrate 21 when the measurand pressure increases.

In general, a capacitance C between two parallel plates is determined by a distance d between the plates, an area A of the plates and a dielectric constant $e_0$ of a medium between the plates, and expressed as;

$$C = e_0 A / d \quad (1)$$

Therefore, when the diaphragm 31 is moved by the measurand pressure, the distance between the lower and upper electrodes 22 and 28 is varied, and accordingly the capacitance between the lower and upper electrodes 22 and 28 is varied. The transducer of FIGS. 1A and 1B has a structure which is capable of detecting the absolute pressure without need of any additional reference vacuum chamber.

Figure 2:
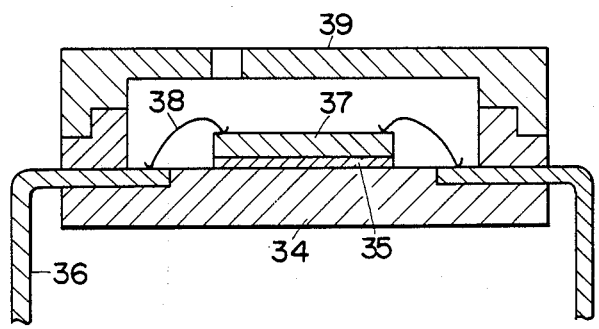
FIG. 2 is a sectional view of a pressure sensor having a pressure transducer according to the present invention, packaged in a sensor housing.

FIG. 2 shows one example of a pressure sensor using the pressure transducer of FIGS. 1A and 1B.

In the sensor of FIG. 2, the pressure transducer of FIGS. 1A and 1B in the form of a sensor chip 37 is enclosed in a sensor housing formed by a plastic support 34 and a cap 39 having a pressure port. The sensor chip 37 is bonded to the plastic support 34 by an adhesive layer 35. The sensor chip 37 is connected with terminals 36 through lead wires 38.

The bonding of the sensor chip 37 to the support 34 need not be hermetic. However, it is preferable to use, as the adhesive layer 35, an adhesive having softness or flexibility, such as an adhesive based on silicone resin or Teflon, in order to alleviate thermal stresses due to difference in the thermal expansion coefficient between the plastic support 34 and the sensor chip 37.

FIGS. 3A-3G show a process for fabricating the transducer of FIGS. 1A and 1B.

At the step shown in FIG. 3A, the highly doped diffusion region 22 is selectively formed in the surface of the silicon substrate 21, and then the lower insulating layer 23 is formed by thermal oxidation of the silicon surface.

At the next step of FIG. 3B, a polysilicon layer having a thickness of several micrometers is formed on the surface of the lower insulating layer 23 by CVD (chemical vapor deposition). Then, unnecessary parts of the polysilicon layer are removed, and only a part 32 is left by photoetching. The resulting polysilicon layer 24 excluding a central portion 33 is heavily doped with boron impurity by ion implantation or other techniques, to such an extent that the boron concentration is equal to or higher than $10^{20}$ atoms/cm$^3$.

At the step of FIG. 3C, the upper insulating layer 26 of $SiO_2$ and/or $Si_3N_4$ is formed on the polysilicon layer 24 by thermal oxidation by CVD. Then, the small perforations 27 are opened in a central portion of the upper insulating layer 26 over the central portion 33 of the polysilicon layer 24. A dry process such as RIE (reactive ion etching) is preferable as an etching process for opening the perforations 27, in order to minimize lateral elongation of the perforations 27.

At the step of FIG. 3D, the cavity 25 is formed in the polisilicon layer 24 by etching away the undoped central portion 33 through the perforations 27 of the upper insulating layer 26. It is possible to etch away only the central portion 33 which is not doped with boron, and to leave the heavily doped peripheral portion of the polisilicon layer 24 unetched, by using a strong alkaline liquid etchant such as ethylenediamine or KOH.

At the step of FIG. 3E, a conductive thin film of a predetermined thickness is formed on the perforated upper insulating layer 26 by vacuum evaporation, sputtering, LPCVD or plasma CVD in a vacuum equal to or less than 10 torr, and the upper electrode 28 is formed by removing unnecessary parts of the conductive film by photoetching. In this way, the vacuum cavity 25 is sealed up by closing the perforations 27 with the upper electrode 28.

Figure 4A:
FIGS. 4A–4C are sectional views showing a step, which can be used in the process of the first embodiment, for forming a cover layer on a perforated layer.
Figure 4B:
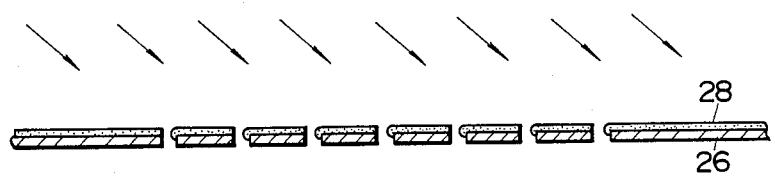
Figure 4C:
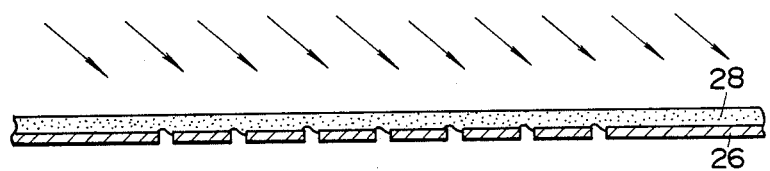

In this case, it is desired to prevent the material of the upper electrode 28 from passing through the perforations 27 and from depositing in the form of a film on the lower insulating layer 23 because the dielectric constant of the deposited film on the lower insulating layer 23 affects the sensor characteristics, and causes unit-to-unit variations. It is possible to prevent formation f such an undesired deposited film by reducing the size of the perforations 27 and/or by depositing the upper electrode 28 obliquely as shown in FIGS. 4A-4C. At a step of FIG. 3F, the surface insulating layer 29 is formed on the surface of the upper electrode 28 by a method such as thermal oxidation or CVD, and then the contact holes are bored in the surface insulating layer 29 and the lower insulating layer 23 by photoetching.

At a step of FIG. 3G, the metal leads 30 are formed by forming a film of metal such as Al, and pattening the metal film by photoetching. Thus, the transducer of FIGS. 1A and 1B is completed.

As expressed by the above mentioned equation (1), the output of the this pressure transducer is proportional to the reciprocal of the distance d between the lower and upper electrodes 22 and 28. A change of the distance d, that is, the displacement of the diaphragm 31 with respect to a change in the pressure acting on the outer surface of the diaphragm 31, is dependent on the material, size and thickness of the diaphragm 31. Although the diaphragm 31 of FIGS. 1A and 1B is rectangular, it is optional to employ a diaphragm of a circular shape or some other shape.

Figure 5:
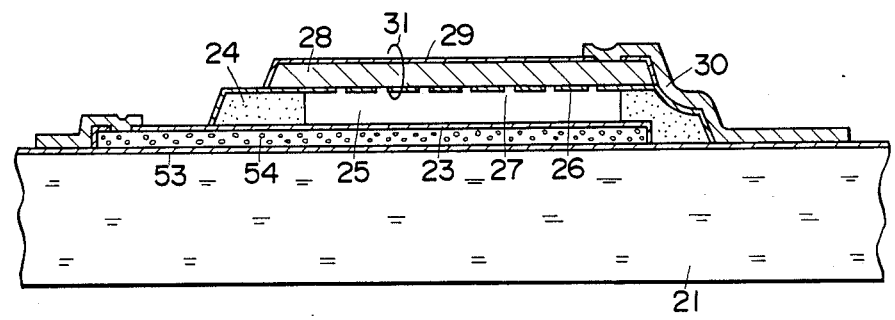
FIG. 5 is a sectional view of a pressure transducer of a second embodiment of the present invention.

A second embodiment of the present invention is shown in FIG. 5. A pressure transducer of FIG. 5 is also a capacitive transduction type. In the pressure transducer of FIG. 5, a conductive film layer 54 is substituted for the highly doped semiconductor region 22 of FIG. 1A, and used as the lower electrode. The conductive film layer 54 of FIG. 5 is formed on an underlying insulating layer 53 formed on the surface of the Si substrate 21. However, it is optional to employ a substrate of insulating material such as glass.

A third embodiment of the present invention is shown in FIGS. 6A, 6B and 7A–7G. A pressure transducer of the third embodiment is a piezoresistive type in which a change in pressure is converted into a resistance change.

Figure 6A:
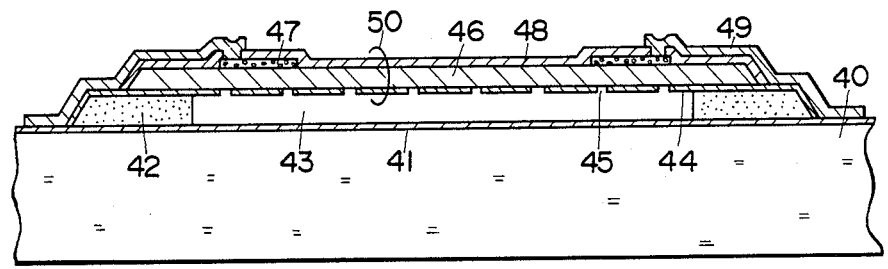
FIG. 6A is a sectional view showing a pressure transducer of a third embodiment of the present invention.
Figure 6B:
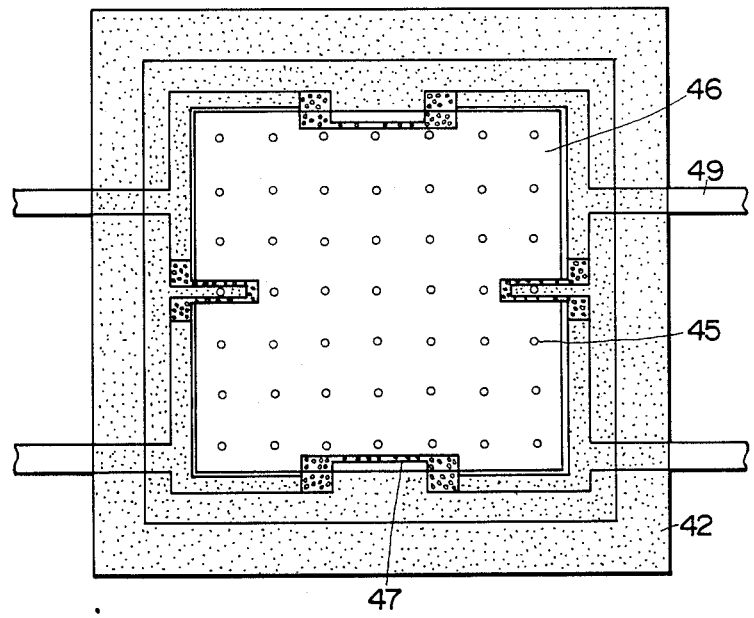
FIG. 6B is a plan view of the transducer of FIG. 6A.

The transducer shown in FIGS. 6A and 6B includes a silicon substrate 40, a lower insulating layer 41, a support layer 42 having a cavity 43, a perforated upper insulating layer 44 having a plurality of small perforations 45, a thin film cover layer 46 of a predetermined thickness, a surface insulating layer 48 and one or more piezoresistive elements 47. The lower insulating layer 41 is formed on the surface of the substrate 40. The support layer 42 is formed on the lower insulating layer 41. The perforated upper insulating layer 44 is formed on the support layer 42, and the perforated part of the upper insulating layer 44 forms a ceiling of the cavity 43. The cover layer 46 of this embodiment is made of insulating material, and formed on the upper insulating layer 44. The cavity 43 is held at a predetermined reference pressure, and sealed up by forming the cover layer 46 on the perforated upper insulating layer 44.

The piezoresistive elements 47 of polysilicon are formed at predetermined positions on the surface of the cover layer 46. The piezoresistive elements 47 are covered and protected by the surface insulating layer 48. The surface insulating layer 48 is formed with contact holes, through which the piezoresistive elements 47 are connected with metal leads 49.

In this transducer, like the transducer of FIGS. 1A and 1B, the cavity 43 is used as a reference pressure (vacuum) chamber, and a diaphragm 50 composed of the upper insulating layer 44, the cover layer 46 and the surface insulating layer 48 deflects in response to a pressure acting on the exterior surface of the diaphragm 50. The diaphragm 50 moves inwardly toward the substrate 40 when the external measurand pressure increases. The resistances of the piezoresistive elements 47 are changed by stresses produced by deflection of the diaphragm 50. Accordingly, the pressure can be measured from the resistances of the piezoresistive elements 47. The transducer of FIGS. 6A and 6B is capable of measuring the absolute pressure with a structure of its own, so that the packaging is very easy as in the first embodiment.

FIGS. 7A–7G show a process of the third embodiment, for fabricating the transducer of the third embodiment.

Figure 7A:
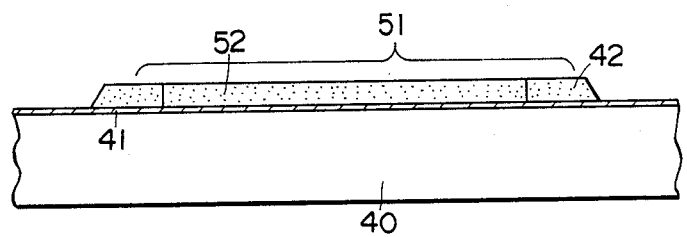
FIGS. 7A–7G are sectional views showing sequential steps of a process of the third embodiment.

At the step of FIG. 7A, the lower insulating layer 41 is formed by passivation of the surface of the silicon substrate 40. The passivation is achieved by thermal oxidation.

Then, the polysilicon layer 42 is formed by depositing polysilicon to a thickness of several micrometers on the surface of the lower insulating layer 41 by CVD, and by removing unnecessary parts of the polysilicon deposition, and leaving only a part 51 by photoetching. Then, boron impurity is added to the polysilicon layer 42 by ion implation or other technique, with the exception of a central portion 52 which is to be removed to form the cavity 43. Therefore, the central portion 52 of the polysilicon layer 42 is not doped, but the peripheral portion is heavily doped with boron (the impurity concentration is equal to or higher than $10^{20}$ atoms/cm$^3$, for example).

Figure 7B:
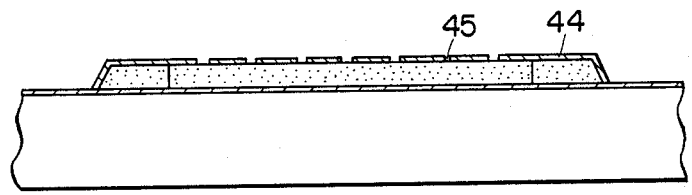

At the next step of FIG. 7B, the upper insulating layer 44 of SiO$_2$, Si$_3$N$_4$ and/or other material is formed on the polysilicon layer 42 by thermal oxidation, CVD or other process. Then, the regularly arranged perforations 45 are formed in the upper insulating layer 44 by etching. The perforations 45 are located on the central portion 52 of the polysilicon layer 42. A dry process, such as RIE, is preferable as an etching process for opening the perforations 45.

Figure 7C:
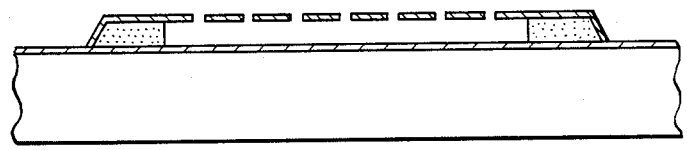

At the step of FIG. 7C, the cavity 43 is formed by etching away the undoped central portion 52 of the polysilicon layer 42 through the perforations 45 of the upper insulating layer 44. The highly doped peripheral portion of the polysilicon layer 42 can be left without being etched away, by using the strong alkaline liquid etchant such as ethylendiamine or KOH.

Figure 7D:
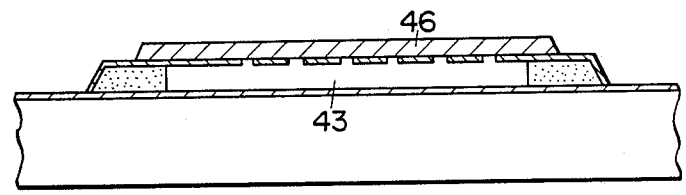

At the step of FIG. 7D, the cavity 43 is sealed by forming the insulating cover layer 46 of the predetermined thickness on the perforated upper insulating layer 44 while the sensor chip is kept in a vacuum chamber of a pressure equal to or lower than 10 torr. Thus, the pressure in the sealed cavity 43 is set at the predetermined reference pressure (vacuum). The cover layer 46 is formed by forming an insulating film by vacuum evaporation, sputtering or other technique, and removing unnecessary parts of the film by photoethcing.

During this step of forming the cover layer 46, a film of the material of the cover layer 46 may deposite on the lower insulating layer 41 through the perforations 45. However, such a film has only a very small influence on the characteristics of the transducer of the piezoresistive type.

Figure 7E:
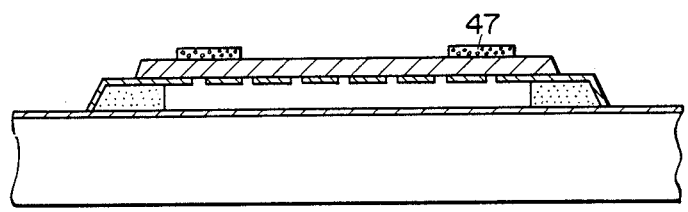

At a step of FIG. 7E, the piezoresistive elements 47 are formed by forming a polysilicon film on the cover layer 46 by CVD, and removing unnecessary parts of the polysilicon film by photoetching. The polysilicon piezoresistive elements 47 are doped with impurities at a predetermined doping level.

Figure 7F:
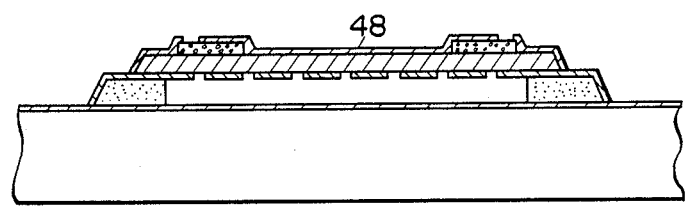
Figure 7G:
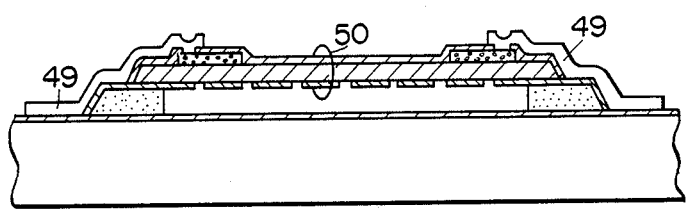

At a step of FIG. 7F, the surface insulating layer 48 is formed on the piezoresistive elements 47 and the cover layer 46, and the contact holes are opened in the surface insulating layer 48 by photoetching. At a step of FIG. 7G, the metal leads 49 are formed by forming film of metal such as Al and patterning the metal film. The transducer of FIGS. 6A and 6B is completed in this way.

In the third embodiment, it is possible to use an insulating substrate instead of the silicon substrate, and to eliminate the lower insulating layer 41.

A fourth embodiment of the present invention is shown in FIGS. 8A, 8B and 9A–9H. A pressure transducer of the fourth embodiment is provided with first and second perforated layers 56 and 60 in order to prevent the material of the cover layer from passing through the perforations.

Figure 8A:
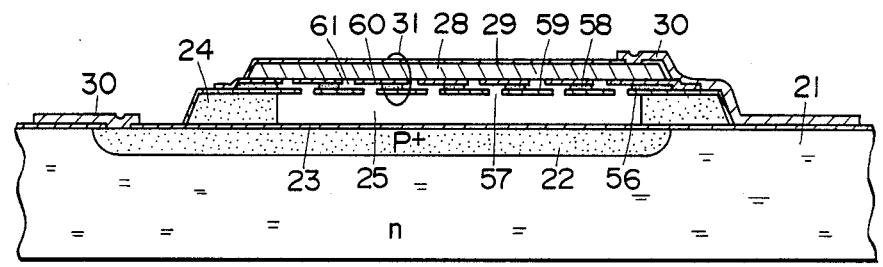
FIG. 8A is a sectional view showing a pressure transducer of a fourth embodiment of the present invention.
Figure 8B:
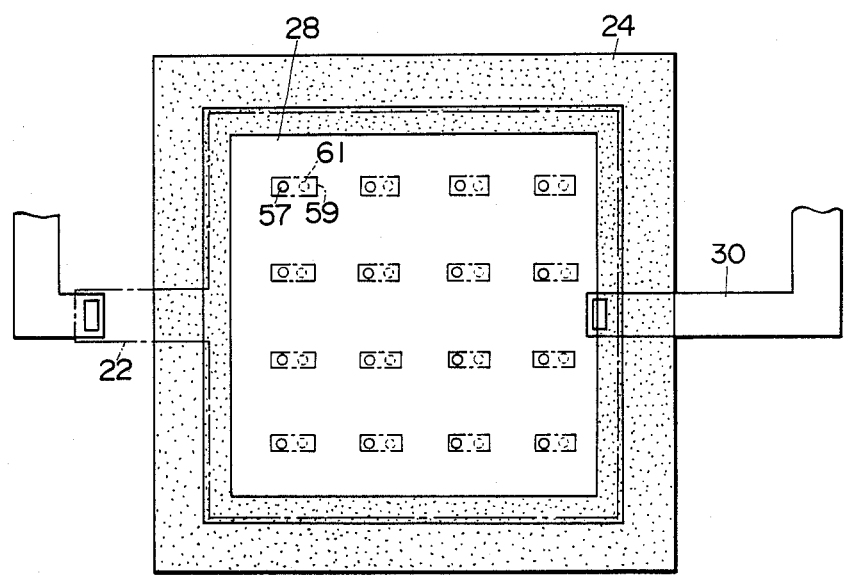
FIG. 8B is a plan view of the transducer of FIG. 8A.

Like the transducer of FIGS. 1A and 1B, the transducer of FIGS. 8A and 8B is the capacitive type, and includes an n-type silicon substrate 21, a highly doped p$^+$-type diffusion region 22 serving as a lower electrode, a lower insulating layer 23, a support layer 24 having a cavity 25, a cover layer 28 serving as an upper electrode, a surface insulating layer 29 and metal leads 30.

In the transducer of FIGS. 8A and 8B, the inner layer of the diaphragm 31 is constituted by the first and second perforated insulating layers 56 and 60, and an interlying layer 58, in contrast to the single perforated layer 26 in the first embodiment. The first perforated insulating layer 56 is formed on the support layer 24, and covers the cavity 25. The first perforated layer 56 has a plurality of first perforations 57 which are located on the cavity 25. The interlying layer 58 has a plurality of interlying perforations 59, and is formed on the underlying first perforated layer 56. The second perforated layer 60 has a plurality of second perforations 61, and is formed on the interlying layer 58. The perforations 59 and 61 are located above the cavity 25.

The first and second perforations 57 and 61 are placed out of alignment so that there is formed no overlap between the first and second perforations 57 and 61 when they are viewed in the plan view of FIG. 8B. Each interlying perforation 59 connects one of the first perforations 57 with one of the second perforations 61. One end of each interlying perforation 59 overlaps the first perforation 57, and the other end overlaps the second perforation 61. In this embodiment, as shown in FIG. 8B, the first perforations 57, the second perforations 61 and the interlying perforations 59 are all equal in number, and arranged in a rectangular array (or matrix), each member of which consists of one of the first perforations 57, one of the interlying perforations 59 and one of the second perforations 61. In each member of the array, the first perforation 57 and the second perforation 61 extend vertically in parallel to, and at a predetermined distance from, each other, and the interlying perforation 59 extends laterally from the first perforation 57 to the second perforation 61, so that a cranked passage is formed.

The transducer of FIGS. 8A and 8B is operated in the same manner as the transducer of FIGS. 1A and 1B.

FIGS. 9A-9H show sequential steps of a process of the fourth embodiment for fabricating the transducer of FIGS. 8A and 8B.

Figure 9A:
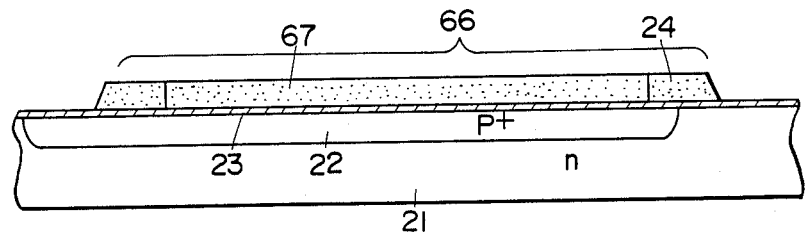
FIGS. 9A–9H are sectional views showing sequential steps of a process of the fourth embodiment.

A step of FIG. 9A is for forming, first, the highly doped diffusion region 22 in the surface of the silicon substrate 21, secondly forming the lower insulating layer 23 by thermal oxidation, and third forming the polysilicon layer 24 on the lower insulating layer 23. The polysilicon layer 24 is formed by depositing a polysilicon film of several micrometers by CVD, and removing unnecessary parts to leave a part 66 only by photoetching. After that, the polysilicon layer 24 is heavily doped with boron with the exception of a central portion 67. The doping is achieve by ion implantion, for example. The impurity concentration of the heavily doped peripheral portion surrounding the masked central portion 67 is equal to or higher than $10^{20}$ atoms/cm$^3$.

Figure 9B:
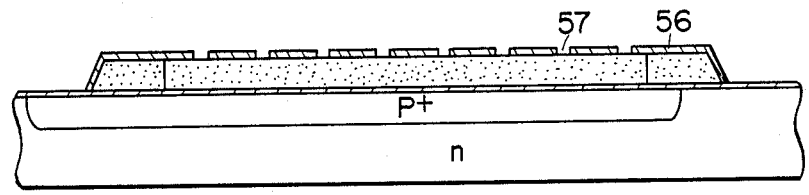

A next step of FIG. 9B is a step for forming the first insulating layer 56 of SiO$_2$ and/or Si$_3$N$_4$ on the polysilicon layer 24 by CVD, and opening the first perforations 57.

Figure 9C:
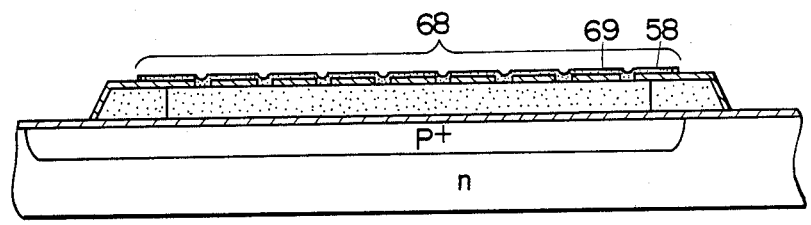

At a step of FIG. 9C, the interlying layer 58 is formed by depositing a polysilicon film on the first insulating layer 56 by CVD, and removing unnecessary parts of the polysilicon film to leave a part 68 only. The polysilicon interlying layer 58 is then heavily doped with boron impurity with the exception of portions 69 which are to be etched away to form the interlying perforations. The doping level is equal to or higher than $10^{20}$ atoms/cm$^3$.

Figure 9D:
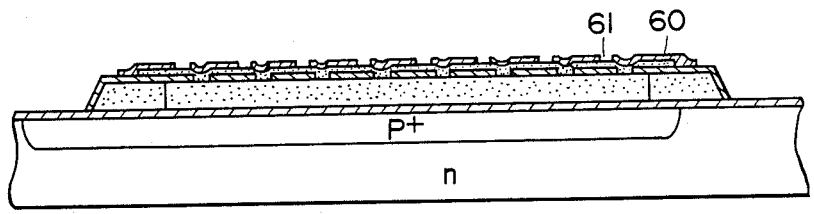

A step of FIG. 9D is a step for forming the second insulating layer 60 of SiO$_2$ an/or Si$_3$N$_4$ on the polysilicon layer 58 by thermal oxidation or CVD, and opening the second perforations 61 at such positions that the second perforations 61 are not coincident with the first perforations 57.

Figure 9E:
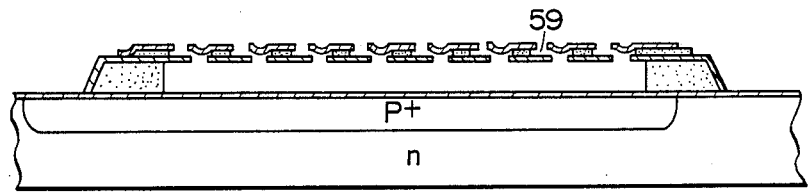

At a step of FIG. 9E, the interlying perforations 59, and the cavity 25 are formed by etching away the portions 69 of the polysilicon interlying layer 58, and the central portion 67 of the polysilicon support layer 24 through the second perforations 61 and the first perforations 57. The etching is performed by using a strong alkaline etchant such as ethylendiamine or KOH, so that the highly doped parts of the layers 58 and 24 are left almost unetched.

Figure 9F:
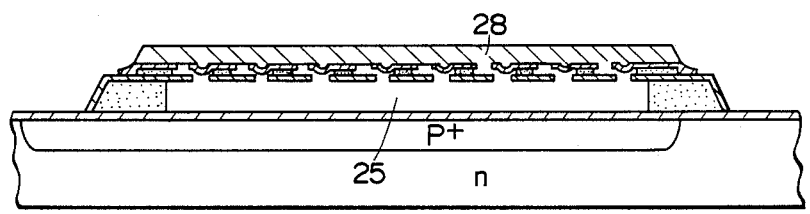

At a step of FIG. 9F, a conductive thin film of a predetermined thickness is formed on the second insulating layer 60 by vacuum evaporation, sputtering, LPCVD, or plasma CVD while the chip is confined in a vacuum chamber equal to or lower than 10 torr. This conductive thin film is formed into the covering layer 28 by removing unnecessary parts by photoetching. The covering layer 28 closes the second perforations 79 and seals the cavity 25.

In this case, no conductive film is formed on the lower insulating layer 23 in the cavity 25 because each first perforation 57 is dislocated from the position immediately below the associated second perforation.

Figure 9G:
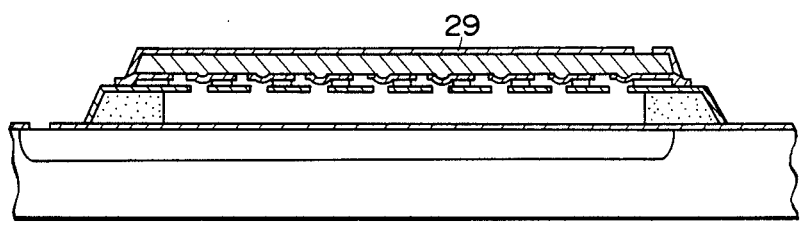
Figure 9H:
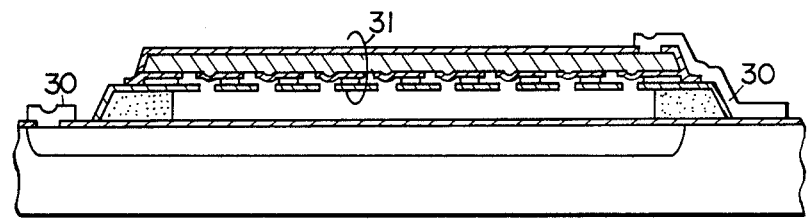

A step of FIG. 9G is a step of performing thermal oxidation or CVD to form the surface insulating layer 29, and contact hole opening. At a step of FIG. 9H, the metal leads 30 are formed, and the transducer of FIGS. 8A and 8B is completed.

Figure 10:
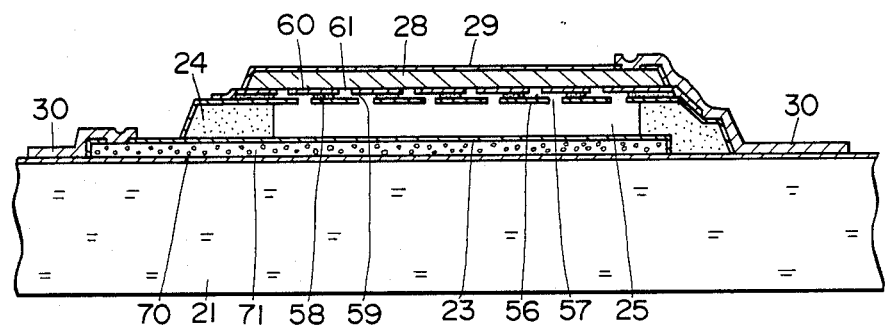
FIG. 10 is a sectional view of a pressure transducer of a fifth embodiment.

A fifth embodiment of the present invention is shown in FIG. 10. A pressure transducer of FIG. 10 has a diaphragm similar to that of the transducer of FIG. 8A, but the transducer of FIG. 10 is different from the transducer of FIG. 8A in that the transducer of FIG. 10 has a lower electrode 71 similar to the lower electrode 54 of the transducer of FIG. 5. The lower electrode of a thin conductive film is formed on an underlying insulating layer 70 which is formed on the silicon substrate 21. It is possible to employ an insulating substrate.

Figure 11A:
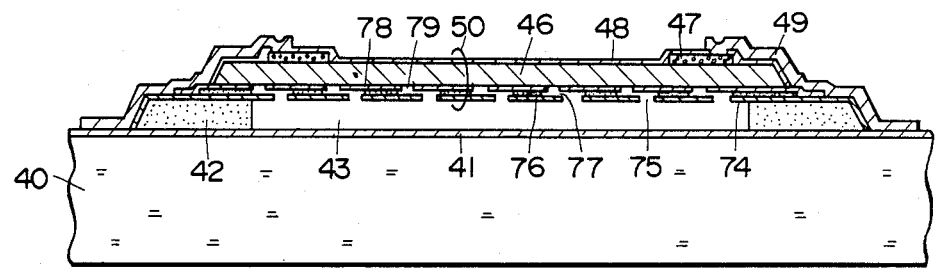
FIG. 11A is a sectional view of a pressure transducer of a sixth embodiment.
Figure 11B:
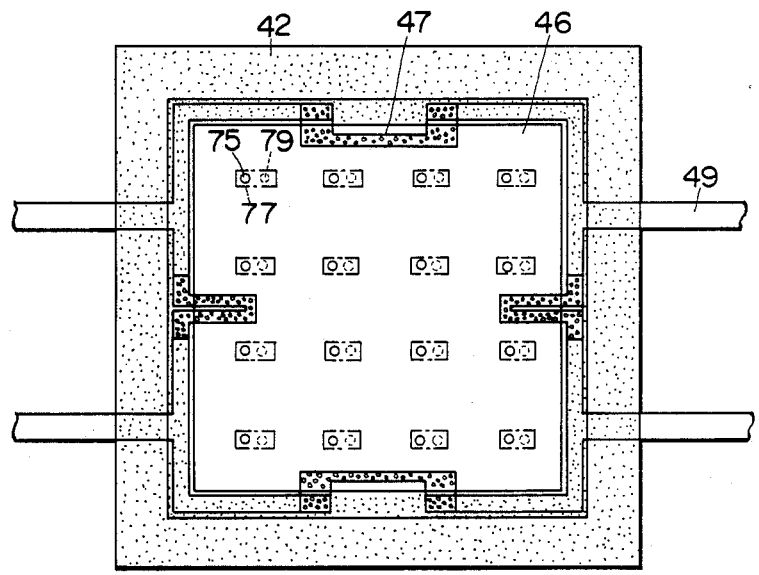
FIG. 11B is a plan view of the transducer of FIG. 11A.
Figure 12:
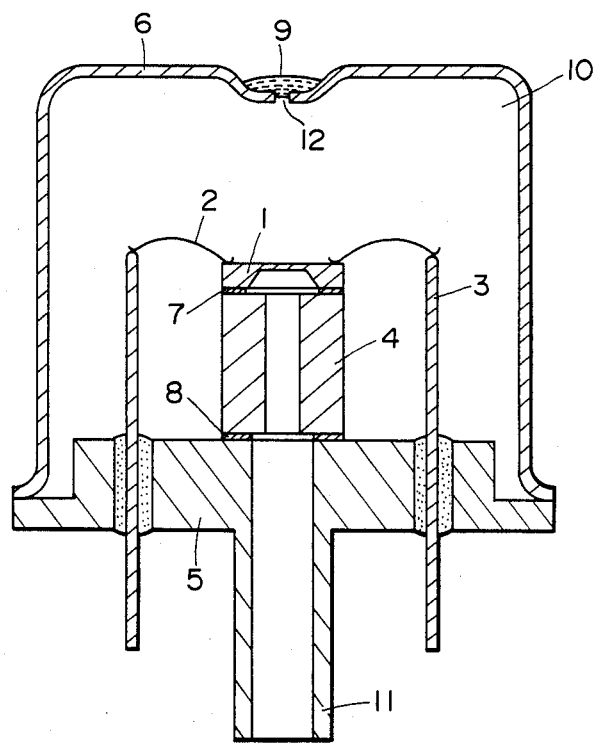
FIG. 12 is a sectional view showing a conventional pressure sensor.

A sixth embodiment of the present invention is shown in FIGS. 11A and 11B. A pressure transducer of FIGS. 11A and 11B is the piezoresistive type having one or more piezoresistive elements 47 like the transducer of FIG. 6A, but a diaphragm 50 of the transducer of FIGS. 11A and 11B is similar to the diaphragm of the transducer of FIG. 8A. As shown in FIG. 11A, the inner layer of the diaphragm 50 is composed of a first insulating layer 74 having a plurality of first perforations 75, an interlying layer 76 having a plurality of interlying perforations 77, and a second insulating layer 78 having a plurality of second perforations 79. As shown in FIG. 11B, the perforations 75, 77 and 79 are arranged in the same manner as in the transducer of FIGS. 8A and 8B.

The insulating thin film cover layer 46 is formed on the second insulating layer 78. The piezoresistive elements 47 of polysilicon are formed on the cover layer 46 at predetermined positions, covered by the top surface insulating layer 48, and connected with the metal leads 49.

As explained above, according to the present invention, the reference pressure chamber, and the pressure sensing element such as a diaphragm are formed simultaneously. Therefore, it is possible to produce a large number of sensor chips having self contained vacuum reference chambers simultaneously by using batch processing of silicon wafers. The cost per unit is correspondingly decreased.

The pressure transducer fabricating process of the present invention is compatible with the IC fabricating process. Therefore, it is very easy to form electronic components of a circuit for processing or conditioning the output signal of the pressure transducer, in the same chip.

Furthermore, it is possible to control the thickness of the pressure sensing diaphragm accurately. Therefor, the present invention enables reduction of the diaphragm size, and hence reduction of the chip size, which results in reduction of the fabricating cost.

What is claimed:

1. A pressure transducer comprising;
   a substrate,
   a diaphragm layer,
   a support layer interposed between said substrate and said diaphragm layer, said support layer having an opening, both sides of which are closed by said substrate and said diaphragm layer to form a hermetically sealed internal cavity serving as a reference pressure chamber, and
   means for converting a displacement of said diaphragm layer into an electrical signal,
   wherein said diaphragm layer comprises an inner layer extending over said cavity of said support layer to constitute an interior surface of said cavity, and having a plurality of perforations opening into said cavity, and a cover layer which is formed on said inner layer and closes said perforations to seal said cavity, wherein said support layer is made of a doped semiconductor and said inner layer comprises a first layer of an insulating material, and wherein said diaphragm layer is spaced apart from said substrate by said support layer.

2. A pressure transducer according to claim 1, fabricated by a process comprising;
   a first step of forming said support layer on said substrate,
   a second step of forming said inner layer on said support layer, and forming said perforations in said inner layer by etching,
   a third step of forming said cavity in said support layer by etching through said perforations of said inner layer, and
   a fourth step of forming said cover layer on said inner layer, and sealing said cavity wherein said first step comprises a step of selectively doping said support layer so that said support layer has an undoped central region and a highly doped peripheral region surrounding said central region, and said third step is performed by etching away said central region of said support layer and leaving said highly doped peripheral region unetched.

3. A pressure transducer according to claim 2 wherein said support layer is made of silicon.

4. A pressure transducer according to claim 3 wherein said support layer is made of doped polysilicon.

5. A pressure transducer according to claim 2 wherein said converting means is a capacitive type, converting the displacement of said diaphragm into a change in capacitance between a lower electrode formed under said cavity, and an upper electrode constituted by said cover layer of said diaphragm layer.

6. A pressure transducer according to claim 5, wherein said lower electrode is formed on said substrate.

7. A pressure transducer according to claim 1, wherein said support layer is made of a semiconductor doped with boron.

8. A process for fabricating a pressure transducer, comprising;
   a first step of forming a support layer on a substrate,
   a second step of forming an inner layer on said support layer, and forming perforations in said inner layer by etching,
   a third step of forming a cavity in said support layer under said inner layer by etching through said perforations of said inner layers, and
   a fourth step of forming a cover layer on said inner layer to seal said cavity,
   wherein said support layer is made of a semiconductor material, and said inner layer comprises a first layer of an insulating material, and wherein said first step comprises a step of selectively doping said support layer so that said support layer has an undoped central region and a highly doped peripheral region surrounding said central region, and said third step is performed by etching away said central region of said support layer and leaving said highly doped peripheral region unetched.

9. A process according to claim 8 wherein said support layer is made of silicon.

10. A process according to claim 9 wherein said third step is performed by applying a strong alkaline etchant to said central region of said support layer through said perforations of said inner layer.

11. A process according to claim 10 wherein said fourth step is performed in a vacuum so that said cavity is evacuated to a predetermined degree of vacuum.

12. A process according to claim 8 wherein said second step comprises the step of forming said first layer on said support layer and forming first perforations in said first layer, the step of forming an interlying layer on said first layer, and the step of forming a second layer on said interlying layer and forming second perforations in said second layer at such positions with no overlap between said first and second perforations, and wherein said third step is performed by selectively etching said interlying layer through said second perforations so that each of said second perforations is connected with one of said first perforations, and by selectively etching said support layer to form said cavity through said first and second perforations.

13. A process according to claim 12 wherein said support layer and said interlying layer are made of silicon, and wherein said first step comprises a step of selectively doping said support layer so that said support layer has a highly doped peripheral region which is left unetched by said third step, and an undoped central region which is surrounded by said peripheral region and etched away by said third step, and said second step comprises a step of selectively doping said interlying layer so that said interlying layer is highly doped but has a plurality of undoped regions each of which is located on one of said first perforations and etched away by said third step.

14. A process according to claim 8 wherein, in said first step, boron is used as a dopant for doping said support layer.

15. A pressure transducer comprising:
   a substrate;
   a diaphragm layer;
   a support layer interposed between said substrate and said diaphragm layer, said support layer having an opening, both sides of which are closed by said substrate and said diaphragm layer to form a hermetically sealed internal cavity serving as a reference pressure chamber;
   said diaphragm layer comprising an inner layer, of a material different from that of said support layer, extending over said cavity of said support layer to constitute an interior surface of said cavity and having a plurality of perforations opening into said cavity, and a cover layer formed on said inner layer and closing said perforations to seal said cavity; and a capacitive type converting means for converting the displacement of said diaphragm into a change in capacitance between a lower electrode formed under said cavity and an upper electrode constituted by said cover layer of said diaphragm layer;

said substrate comprising a silicon bulk layer of a first conductivity type, a highly doped diffusion region of a second conductivity type formed in said bulk layer and used as said lower electrode, and a lower insulating layer formed on said diffusion region and constituting a lower interior surface of said cavity.

16. A pressure transducer comprising;

a substrate;

a diaphragm layer comprising an inner layer extending over said cavity to form an interior surface of said cavity, said inner layer having a plurality of perforations opening into said cavity, and a cover layer formed on said inner layer and closing said perforations to seal said cavity;

a support layer interposed between said substrate and said diaphragm layer, said support layer having an opening, both sides of which are closed by said substrate and said diaphragm layer to form a hermetically sealed internal cavity serving as a reference pressure chamber, said support layer formed of a material different from that of said inner layer; and piezoresistive means formed in said diaphragm layer for converting the displacement of said diaphragm layer into a change in resistance of said piezoresistive means.

17. A pressure transducer comprising:

a substrate;

a diaphragm layer;

a support layer interposed between said substrate and said diaphragm layer, said support layer having an opening, both sides of which are closed by said substrate and said diaphragm layer to form a hermetically sealed internal cavity serving as a reference pressure chamber;

said diaphragm layer comprising an inner layer, of a first layer of material different from that of said support layer, extending over said cavity, and having a plurality of perforations opening into said cavity, and a cover layer which is formed on said inner layer and closes said perforations to seal said cavity;

said inner layer further comprising an interlying layer formed on said first layer and a second layer formed on said interlying layer, each perforations of said inner layer comprising a first perforation in said first layer, a second perforation in second layer at a displaced position right above said first perforation, and an intellying perforation formed in said interlying layer and connecting said first and second perforations; and means for converting a displacement of said diaphragm layer into an electric signal.

18. The pressure transducer of claim 17, wherein said support layer and said interlying layer are made of silicon, and said first and second layers are made of an insulating material.

* * * * *